United States Patent
Nakayama

(10) Patent No.: US 10,833,623 B2
(45) Date of Patent: Nov. 10, 2020

(54) ELECTRIC POWER CONTROL UNIT

(71) Applicant: Denso Corporation, Kariya (JP)

(72) Inventor: Wataru Nakayama, Nisshin (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 16/216,023

(22) Filed: Dec. 11, 2018

(65) Prior Publication Data

US 2019/0190432 A1 Jun. 20, 2019

(30) Foreign Application Priority Data

Dec. 20, 2017 (JP) .................................. 2017-244310

(51) Int. Cl.
| | |
|---|---|
| *H02P 27/08* | (2006.01) |
| *H02P 29/028* | (2016.01) |
| *H02P 29/024* | (2016.01) |
| *H02P 29/032* | (2016.01) |

(52) U.S. Cl.
CPC ............ *H02P 29/028* (2013.01); *H02P 27/08* (2013.01); *H02P 29/024* (2013.01); *H02P 29/032* (2016.02)

(58) Field of Classification Search
CPC .......... H02P 7/29; H02P 29/68; H02P 29/028; H02P 29/032; B60L 3/04; B60L 7/14; B60L 15/025; B60L 15/20; B60L 50/40
See application file for complete search history.

(56) References Cited

U.S. PATENT DOCUMENTS

| | | | | |
|---|---|---|---|---|
| 5,357,181 | A * | 10/1994 | Mutoh ................ | B60L 3/0038 318/139 |
| 5,739,649 | A * | 4/1998 | Akao ................... | B60L 3/0023 318/139 |
| 6,967,454 | B1 * | 11/2005 | Braun ................... | H02P 29/02 318/563 |
| 6,989,641 | B2 * | 1/2006 | Schulz ................ | G05B 19/4062 318/139 |
| 7,091,684 | B2 * | 8/2006 | Kobayashi ........... | B62D 5/046 318/139 |
| 7,450,355 | B2 * | 11/2008 | Ochiai .................. | H02H 3/05 318/430 |

(Continued)

FOREIGN PATENT DOCUMENTS

| | | |
|---|---|---|
| JP | 2010091366 A | 4/2010 |
| JP | 2010139244 A | 6/2010 |

(Continued)

*Primary Examiner* — Rina I Duda
(74) *Attorney, Agent, or Firm* — Dinsmore & Shohl LLP

(57) ABSTRACT

An electric power control unit configured to control drive power of a three-phase alternating current to be supplied to an electric motor may include: an inverter configured to convert a direct current to the three-phase alternating current; first and second current sensors, each of which is configured to measure a first-phase current in the three-phase alternating current; third and fourth current sensors, each of which is configured to measure a second-phase current in the three-phase alternating current; and a controller configured to control the inverter, and under a condition in which the first current sensor fails, when measured values of the second, the third, and the fourth current sensors do not coincide with each other while the inverter is shut down, the controller may stop to further supply the drive power to the electric motor.

7 Claims, 5 Drawing Sheets

(56) References Cited

U.S. PATENT DOCUMENTS

| | | | | |
|---|---|---|---|---|
| 2006/0022626 A1* | 2/2006 | Kobayashi | ............ | B62D 5/046 |
| | | | | 318/432 |
| 2011/0181292 A1* | 7/2011 | Oowada | ................ | G01R 35/00 |
| | | | | 324/537 |
| 2012/0139467 A1* | 6/2012 | Suzuki | ...................... | H02P 7/29 |
| | | | | 318/472 |
| 2015/0123580 A1* | 5/2015 | Omata | ................ | H02P 29/032 |
| | | | | 318/400.17 |
| 2015/0123581 A1* | 5/2015 | Omata | ................ | H02P 29/028 |
| | | | | 318/400.17 |

FOREIGN PATENT DOCUMENTS

| | | | |
|---|---|---|---|
| JP | 2011091962 A | 5/2011 | |
| JP | 5375059 B2 | 12/2013 | |
| JP | 2015137944 A | 7/2015 | |

* cited by examiner

ELECTRIC POWER CONTROL UNIT

CROSS-REFERENCE TO RELATED APPLICATION

This application claims priority to Japanese Patent Application No. 2017-244310 filed on Dec. 20, 2017, the contents of which are hereby incorporated by reference into the present application.

TECHNICAL FIELD

The teaching disclosed herein relates to an electric power control unit which controls drive power of a three-phase alternating current supplied to an electric motor.

BACKGROUND ART

An electric vehicle is provided with an electric power control unit configured to control supply of drive power of a three-phase alternating current supplied to an electric traction motor. The electric power control unit includes an inverter configured to generate the three-phase alternating current and current sensors configured to measure currents of respective phases of the outputted three-phase alternating current. The electric power control unit performs feedback control of the inverter based on measured values from the current sensors so that the three-phase alternating current follows a target value. When the current sensors fail, the electric motor cannot be controlled normally, so the electric power control unit would benefit from having a function to detect an abnormality of the current sensors. JP 2010-139244 A and JP 2010-091366 A describe techniques that arrange two current sensors for each phase and detects an abnormality of the current sensors from measured values of the two current sensors.

Further, a current sensor provided with a self-diagnostic function which can autonomously detect an abnormality is known. JP 2015-137944 A describes an example of a current sensor provided with a self-diagnostic function.

SUMMARY it is inconvenient that a vehicle immediately becomes incapable of traveling when merely one of its current sensors fails. In some embodiments, a power control unit is capable of continuing to control drive power of an electric motor even when one of the current sensors becomes faulty. In some embodiments, the vehicle is capable of traveling for a while even if one sensor fails. When one sensor becomes faulty and control is continued with remaining current sensors, the electric motor may not be controlled as intended if an abnormality in another current sensor cannot be detected. The description herein relates to an electric power control unit provided with a plurality of current sensors. The description herein provides a technique that is useful in a situation where a failure in a first current sensor is detected and control of drive power of an electric motor is being performed using remaining current sensors. The technique enables to detect a failure in a second current sensor during when the control of the drive power of the electric motor is being performed using the remaining current sensors after the failure in the first current sensor has been detected.

An electric power control unit in a first configuration disclosed herein may comprise an, inverter, first, second, third, and fourth current sensors, and a controller. The inverter is configured to convert a direct current to a three-phase alternating current. Each of the first and the second current sensors is configured to measure a first-phase current in the three-phase alternating current to be supplied to an electric motor. Each of the third and the fourth current sensors is configured to measure a second-phase current in the three-phase alternating current. The controller is configured to control the inverter. Under a condition in which the first current sensor fails and rotation of the electric motor is stopped, the controller compares measured values of the second, the third, and the fourth current sensors. When the measured values of the second, the third, and the fourth current sensors do not coincide with each other while the inverter is shut down, the controller stops to farther supply drive power to the electric motor.

In a case where a failure is detected in one of the current sensors in the electric power control unit of the first configuration, drive power control for the electric motor can be continued with remaining current sensors, and a failure in the remaining current sensors can be detected. The four current sensors may be of a same type. Further, when the measured values of the second, the third, and the fourth current sensors coincide with each other while the inverter is shut down, the controller may calculate third-phase current based on the measured values of the second and the third current sensors, and may continue the drive power control based on a current value of each of three phases.

An electric power control unit of a second configuration disclosed herein may comprise an inverter, first to fifth current sensors, and a controller. The inverter is configured to convert a direct current to a three-phase alternating current. Each of the first and the second current sensors is configured to measure a first-phase current in the three-phase alternating current to be supplied to an electric motor. Each of the third and the fourth current sensors is configured to measure a second-phase current of the three-phase alternating current. The fifth current sensor is configured to measure third-phase current of the three-phase alternating current. The controller is configured to control the inverter. Under a condition in which the fifth current sensor fails, the controller performs following processes based on measured values from the first to the fourth current sensors. When the measured, values of the first and the second current sensors do not coincide with each other or the measured values of the third and the fourth current sensors do not coincide with each other, the controller stops to further supply drive power to the electric motor. When the measured values of the first and the second current sensors coincide with each other and the measured values of the third and the fourth current sensors coincide with each other, the controller calculates the third-phase current from the measured values of the first and the third current sensors, and continues to control the drive power based on current values of respective three phases. Further, under a condition in which the first current sensor fails instead of the fifth current sensor, the controller performs the following process. When the measured values of the second, the third, and the fourth current sensors do not coincide with each other while the inverter is shut down, the controller stops to further supply the drive power to the electric motor. When the measured values of the second, the third, and the fourth current sensors coincide with each other while the inverter is shut down, the controller continues the drive power control based on the measured values of the second, the third, and the fifth current sensors. That is, the controller drives the inverter continuously.

When one of the current sensors fails, the electric power control unit of the second configuration can also continue the control of the drive power of the electric motor using the remaining current sensors and detect an abnormality in the remaining current sensors. Details and further improvements of the technique disclosed herein will be described in the detailed description below.

DETAILED DESCRIPTION

First Embodiment

Figure 1:
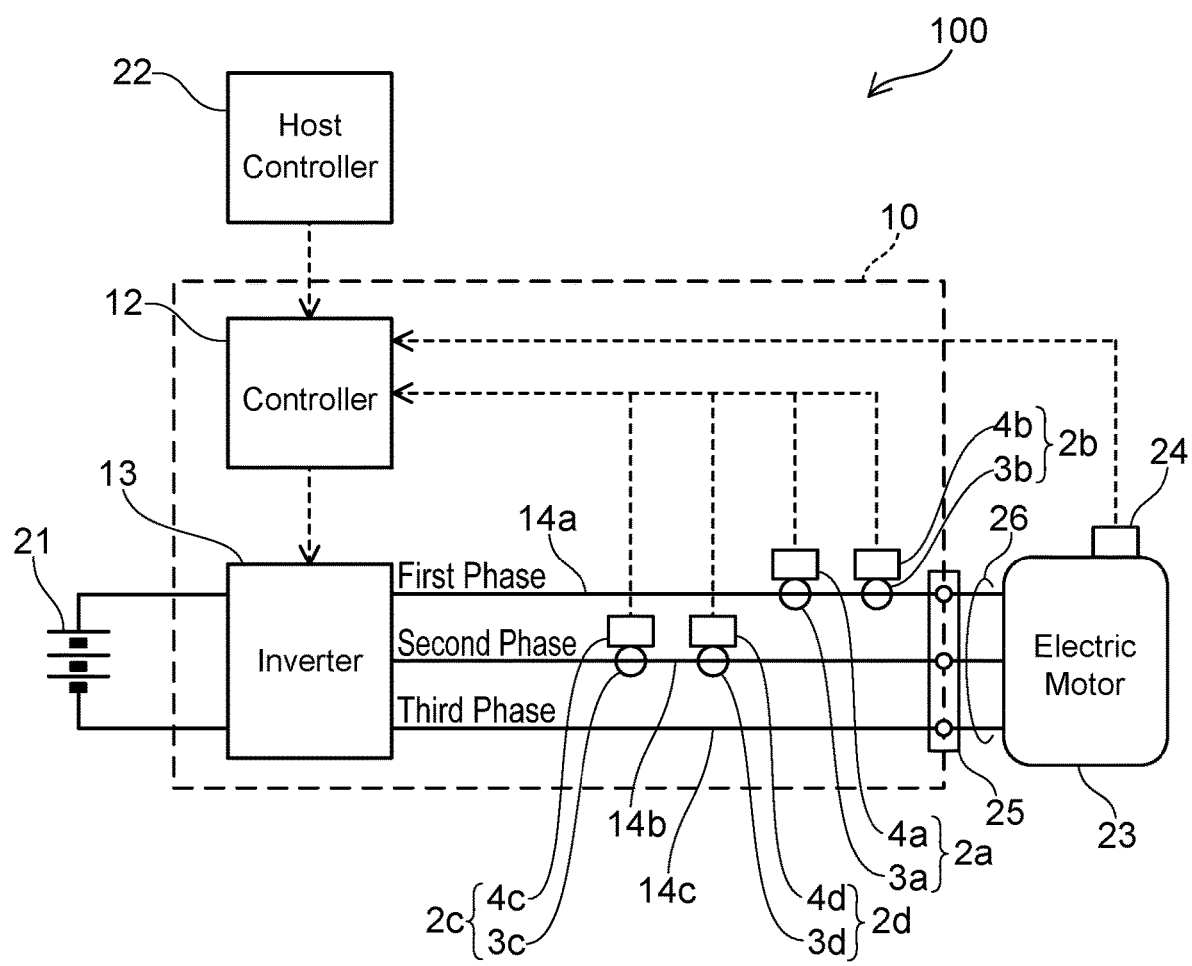
FIG. 1 is a block diagram of an electric system of an electric vehicle including an electric power control unit of a first embodiment.

An electric power control unit 10 according to a first embodiment will be described with reference to the drawings. The electric power control unit 10 is mounted on an electric vehicle 100. The electric power control unit 10 converts a direct current power from a battery 21 to drive power of an electric traction motor 23, FIG. 1 shows a block diagram of the electric vehicle 100 including the electric power control unit 10. The electric traction motor 23 is an AC synchronizing motor driven by a three-phase alternating current. The electric motor 23 is provided with a rotary speed sensor 24 that measures a rotary speed thereof.

The electric power control unit 10 converts the direct current power of the battery 21 to the drive power of the three-phase alternating current suitable for driving the electric traction motor 23, and supplies the same to the electric motor 23. In other words, the electric power control unit 10 controls the driver power of the three-phase alternating current to be supplied to the electric traction motor 23. The electric power control unit 10 receives commands from a host controller 22 and controls the driver power of the electric motor 23. Broken lines with arrows in FIG. 1 show flows of signals.

The electric power control unit 10 includes a controller 12 and an inverter 13. The controller 12 receives a target output command for the electric motor 23 from the host controller 22. The controller 12 acquires the rotary speed of the electric motor 23 from the rotary speed sensor 24. The controller 12 determines a target frequency of alternating current outputs of the inverter 13 from a target output and the rotary speed of the electric motor 23. The controller 12 controls the inverter 13 to realize the determined target frequency. The inverter 13 converts the direct current supplied from the battery 21 to the three-phase alternating current at the determined target frequency. The inverter 13 is configured of a plurality of power transistors, and the controller 12 generates a PWM signal with a duty ratio corresponding to the target frequency, and supplies the same to each of the power transistors.

The three-phase alternating current outputted from the inverter 13 is transmitted to a connector 25 through three bus bars 14a, 14b, 14c. The three bus bars 14a, 14b, 14c are connected to three power cables 26 at the connector 25. The drive power of the three-phase alternating current is supplied to the electric motor 23 through the power cables 26. The three-phase alternating current is generally termed a U phase, a V phase, and a W phase, respectively, but in this description, this will be denoted a first phase, a second phase, and a third phase.

The controller 12 acquires measured values of currents of two phases in the three-phase alternating current which the inverter 13 outputs, and controls the inverter 13 by feedback control so that the output of the three-phase alternating current (the drive power of the electric motor 23) follows the target frequency. The bus bar 14a that transmits a first-phase alternating current is provided with two current sensors 2a, 2b, and the bus bar 14b that transmits a second-phase alternating current is also provided with two current sensors 2c, 2d. Since a total of the currents of the respective phases in the three-phase alternating current is always zero, so a third-phase current value can be calculated from measured values of the first-phase and the second-phase currents. The controller 12 controls the drive power to be supplied to the electric motor 23 based on the measured values of the current sensors 2a to 2d.

The current sensor 2a includes a Hall element 3a and a signal processing circuit 4a. Although not shown, the current sensor 2a includes a ring-shaped core surrounding the bus bar 14a. The ring-shaped core is provided with a gap, and the Hall element 3a is arranged in the gap. When the alternating current flows in the bus bar 14a, an induction magnetic field is generated surrounding the bus bar 14a. Magnetic flux of the induction magnetic field flows especially concentrated in the ring-shaped core. The Hall element 3a is arranged in the gap of the core ring, and measures an intensity of the magnetic flux that flows in the core. The signal processing circuit 4a converts the intensity of the magnetic flux measured by the Hall element 3a to a current value, and sends the same to the controller 12. An example of the ring-shaped core will be described later with reference to FIG. 5.

The current sensor 2a is provided with a self-diagnostic function. The self-diagnostic function is implemented by the signal processing circuit 4a applying a predetermined voltage to the Hall element 3a and measuring an abnormality of the Hall element 3a from an output of the Hall element 3a at this occasion. When an occurrence of an abnormality in itself is detected by the self-diagnostic function, the current sensor 2a (signal processing circuit 4a) sends a signal indicating this occurrence to the controller 12. The self-diagnostic function is described for example in JP 2015-137944 A and is well known, so a detailed description thereof will be omitted. Although there are various types of specific configurations for implementing the self-diagnostic function, the self-diagnostic function which the current sensor 2a is provided may be of any type.

The current sensor 2b is provided with a Hall element 3b and a signal processing circuit 4b, the current sensor 2c is provided with a Hall element 3c and a signal processing circuit 4c, and the current sensor 2d is provided with a Hall element 3d and a signal processing circuit 4d. Configurations of the current sensors 2b to 2d are identical to a configuration of the current sensor 2a.

The electric power control unit 10 is an important device that drives the electric traction motor 23 in the electric vehicle 100. When the electric power control unit 10 stops, the electric vehicle 100 can no longer travel. Providing two current sensors in each of the bus bars 14a, 14b is for endowing redundancy. That is, they are provided so that among the four current sensors 2a to 2d, even if a failure occurs in one of them, the currents of the respective phases which the inverter 13 outputs can still be specified by the remaining three to enable the control of the drive power to be supplied to the electric motor 23 can be continued. When a failure occurs in one of the remaining current sensors during when the vehicle is traveling with the failure having occurred in the one of the current sensors, there is a risk that the electric motor 23 can no longer be controlled appropriately. The electric power control unit 10 of the embodiment can monitor whether a failure is occurring in the remaining current sensors during when the vehicle is traveling with the failure having occurred in the one of the current sensors. A process therefor will be described next. Hereinbelow, the current sensor 2a may be termed the first current sensor 2a. The current sensors 2b, 2c, 2d may respectively be termed the second current sensor 2b, the third current sensor 2c, and the fourth current sensor 2d.

Figure 2:
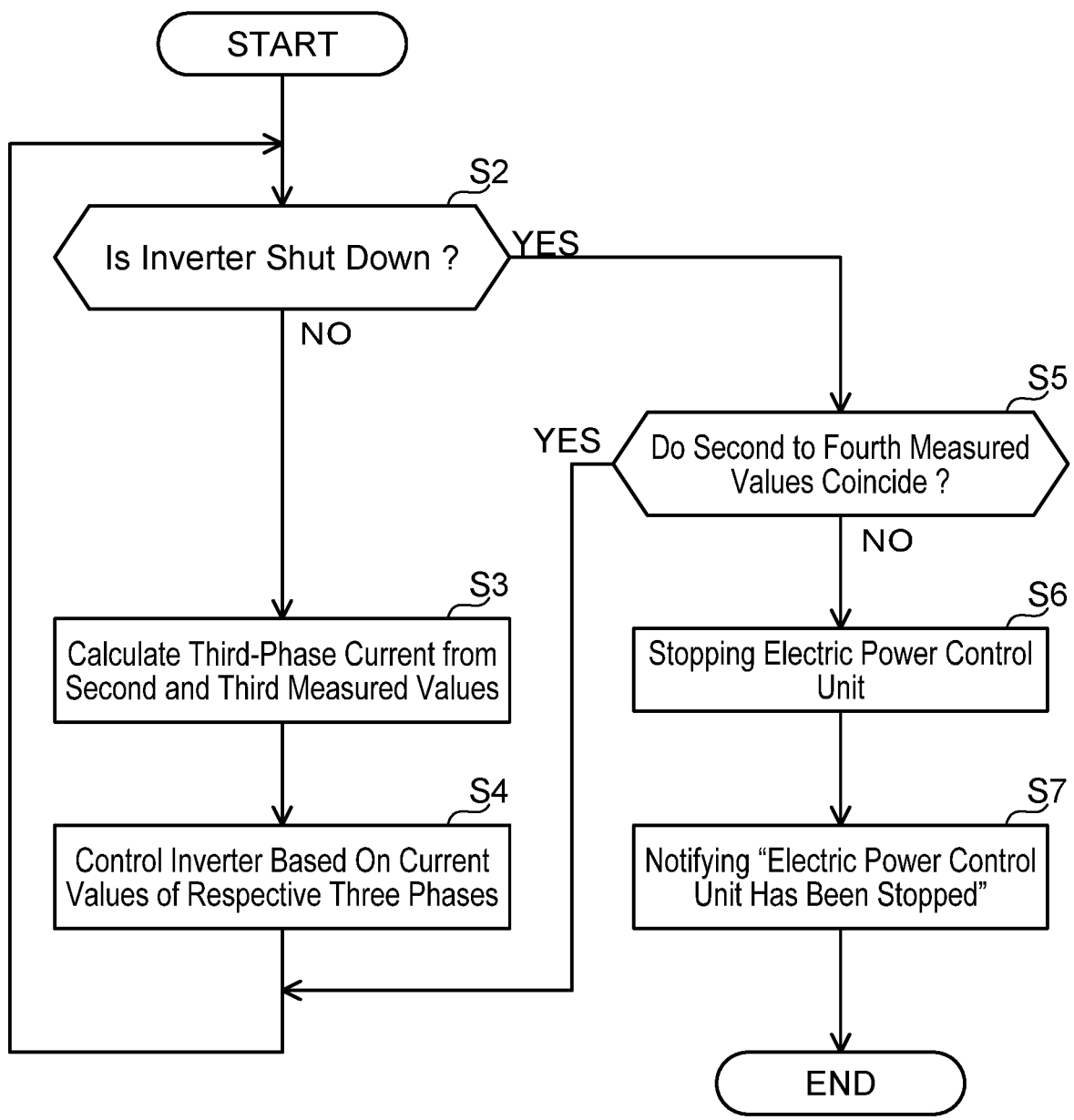
FIG. 2 is a flowchart of a current sensor monitoring process which a controller performs.

FIG. 2 is a flowchart of a current sensor monitoring process which the controller 12 performs. The process of FIG. 2 is initiated periodically after one of the current sensors 2a to 2d has been determined as having failed by the self-diagnostic function. Since the current sensors 2a to 2d are of the same type, it will hereinbelow be assumed that the first current sensor 2a has been determined as having failed by the self-diagnostic function. The signal processing circuit 4a of the first current sensor 2a detects that a failure is occurring in the first current sensor 2a, and sends a notification notifying this to the controller 12. When the notification notifying that the first current sensor 2a has failed is received, the controller 12 initiates the process of FIG. 2. In FIG. 2, the measured value of the second current sensor 2b will be denoted as the "second measured value", the measured value of the third current sensor 2c will be denoted as the "third measured value", and the measured value of the fourth current sensor 2d will be denoted as the "fourth measured value". That is, the "second measured value" means the measured value of the first-phase current which the second current sensor 2b measured. The "third measured value" means the measured value of the second-phase current which the third current sensor 2c measured. The "fourth measured value" means the measured value of the second-phase current which the fourth current sensor 2d measured.

In a case where the inverter 13 is shut down, the controller 12 checks whether an abnormality is occurring in any of the remaining three current sensors (step S2: YES, S5). The "inverter 13 is shut down" means that all switching elements in the inverter 13 are turned off. For example, the inverter 13 is shut down when the vehicle stops at a traffic signal.

In the case where the inverter 13 is shut down (step S2: YES), the controller 12 compares the measured value of the second current sensor 2b (second measured value) and the measured value of the third current sensor 2c (third measured value) and the measured value of the fourth current sensor 2d (fourth measured value). Since the inverter 13 is shut down, no current should be flowing in all of the phases in the three-phase alternating current output of the inverter 13. At this occasion, in a case where the second, the third, and the fourth measured values do not coincide with each other (step S5: NO), which is in other words, in a case where one of the outputs of the second to the fourth current sensors 2b to 2d are not zero, it can be determined that a failure is occurring in this current sensor in this case, the drive power of the electric motor 23 cannot be controlled appropriately, so the controller 12 stops the electric power control unit 10 (step S6), and notifies that the electric power control unit 10 has been stopped (step S7).

A notification that the electric power control unit 10 has been stopped is sent to an instrument panel and a diagnostic memory. The instrumental panel turns on a lamp indicating that a power system has been stopped due to an abnormality occurring in the vehicle. The diagnostic memory is a non-volatile memory, and data related to the occurrence of the abnormality in the current sensor and date and time of the occurrence is stored in the diagnostic memory. The diagnostic memory is a memory which a service staff of the vehicle will refer to later on. The service staff can utilize contents of the diagnostic memory in a vehicle maintenance. The notification, of the electric power control unit 10 having been stopped may be sent to a vehicle service station wirelessly. After a process of step S7, the controller 12 shuts itself down.

In a process of step S5, the controller 12 determines whether or not the second to the fourth measured values coincide with each other within a predetermined error margin.

In a case where the second to the fourth measured values coincide with each other (step S5: YES), the controller 12 determines that the current sensors 2b to 2d are operating normally. In this case, the process in the controller 12 returns to step S2.

On the other hand, in a case where the inverter 13 is not shut down (step S2: NO), the controller 12 uses the remaining three current sensors 2b to 2d to continue the control of the inverter 13. That is, after one of the current sensors 2a to 2d has been determined as having failed, the controller 12 continues the control of the inverter 13 with the remaining three current sensors. The controller 12 performs monitoring of the remaining three current sensors when the inverter 13 is shut down. This method is based on a probabilistic aspect that a probability of two current sensors failing consecutively within a short period of time is extremely low.

In the case where the inverter 13 is not shut down, the controller 12 specifically performs the following process. The controller calculates a third-phase current value front the measured value of the second current sensor 2b (first-phase current value) and the measured value of the third current sensor 2c (second-phase current value) (step S3). The total of the currents of the respective phases in the three-phase alternating current is always zero. Thus, the third-phase current value can be obtained by adding the first-phase current value and the second-phase current value and inverting a positive or negative sign thereof. In step S4, the controller 12 controls the inverter 13 based on the obtained current values of the respective three phases. That is, the control of the drive power to be supplied to the electric motor 23 is continued based on the current values of the respective three phases.

The controller 12 repeats the check in step S5 each time the inverter 13 shuts down (typically, each time the vehicle stops at the traffic signal) to confirm whether a failure is occurring in any of the remaining second to fourth current sensors 2b to 2d. At a tinting immediately after the failure in the first current sensor 2a is detected by the self-diagnostic function when the process of FIG. 2 is initiated, the determination in step S2 becomes NO if the vehicle is traveling. In this case, the drive power control is continued without performing the check of the current sensors 2b to 2d. As described earlier, since the probability that two current sensors failing consecutively in a short period of time is extremely low, such a process is tolerable.

The controller 12 of the electric power control unit 10 of the first embodiment performs the following process in the case where the first current sensor 2a is determined as having failed by the self-diagnostic function. During when the inverter 13 is shut down, the controller 12 compares the measured values of the second to the fourth current sensors 2b to 2d. In the case where the measured values of the second to the fourth current sensors 2b to 2d coincide with each other, the controller 12 calculates the third-phase current based on the measured values of the second and the third current sensors 2b, 2c. Then, the controller 12 continues the control of the drive power to be supplied to the electric motor 23 based on the current values of the respective three phases. The second and the fourth current sensors 2b, 2d may be used to calculate the third-phase current, however, since the third and the fourth current sensors 2c, 2d are the same type, the second-phase current sensor to be used in the third-phase current value calculation may be regarded as the third current sensor 2c.

Further, in the case where the measured values of the second to the fourth current sensors 2b to 2d during when the inverter 13 is shut down did not coincide with each other, the controller 12 determines that a failure is occurring in one of the remaining three current sensors, and stops to further supply the drive power to the electric motor 23. An abnormality detection algorithm in the present embodiment is established also in a case where one of the current sensors is determined as having failed by the self-diagnostic function. The current sensor determined as having failed by the self-diagnostic function may be regarded as the "first current sensor".

As aforementioned, the electric power control unit 10 can continue to control the drive power of the electric motor 23 even after a failure occurs in one current sensor (first current sensor 2a). During when the control of the drive power is continued using the remaining three current sensors 2b to 2d, the electric power control unit 10 (controller 12) can keep monitoring the remaining current sensors 2b to 2d to detect any failure. The electric power control unit 10 can avoid becoming uncontrollable due to a failure in one of the remaining current sensors 2b to 2d during when the drive power control is continued using the remaining three current sensors 2b to 2d.

In the first embodiment, the first to fourth current sensors 2a to 2d may not be provided with the self-diagnostic function. In this case, the controller 12 may detect an initial failure using another algorithm. For example, the controller 12 may check whether a total of the measured values of three current sensors in each combination selecting three out of the four current sensors 2a to 2d when the inverter 13 is shut down is zero. In a case where the total is not zero, it is thereby detected that a failure is occurring in one of the three current sensors. If the total of the measured values of another set of three current sensors is zero, it is thereby detected that those three current sensors are normally operating. Two of the three current sensors with the total not being zero overlap with two of the three current sensors with the total being zero. The current sensor that is not overlapping can be identified as having, a failure occurring therein.

Second Embodiment

Figure 3:
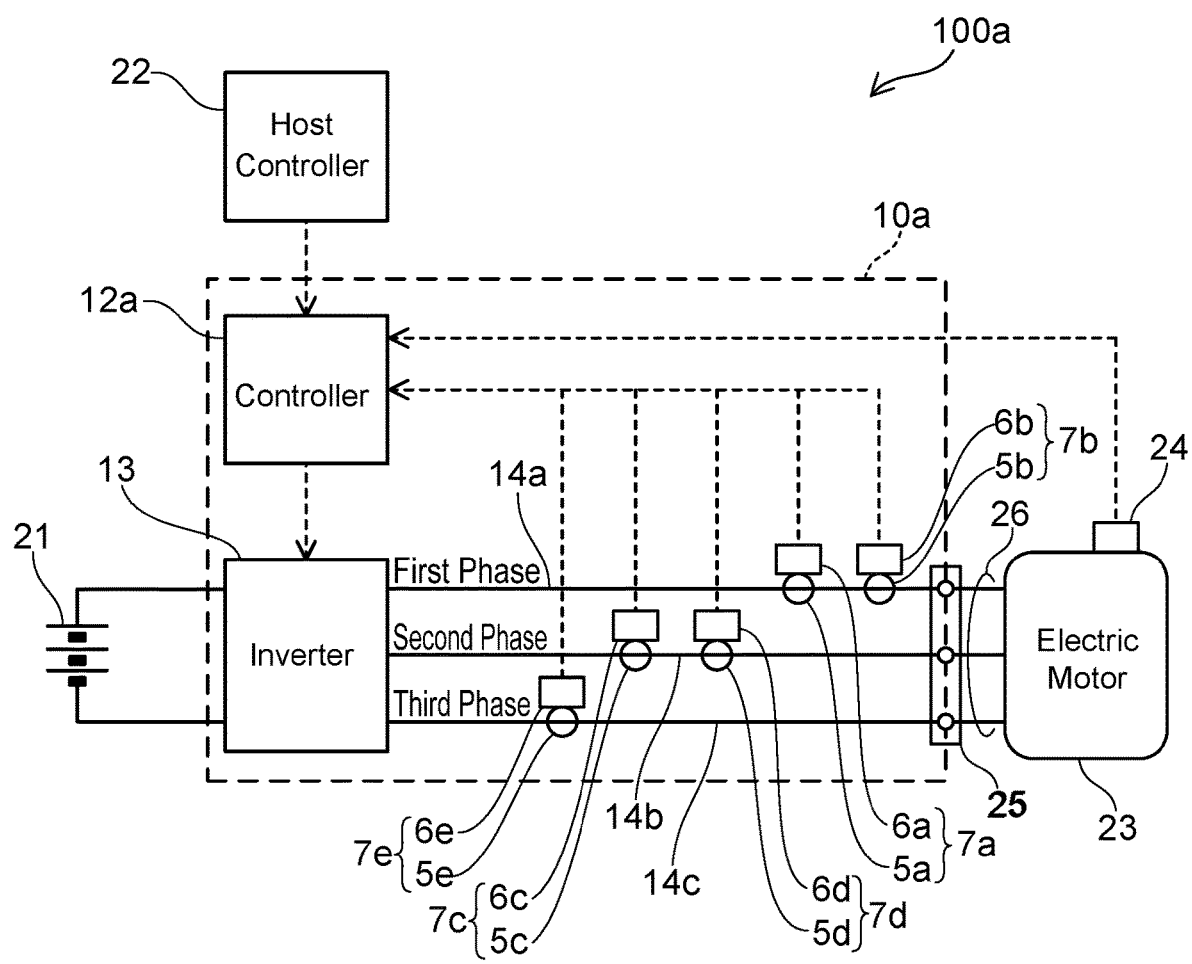
FIG. 3 is a block diagram of an electric system of an electric vehicle including an electric power control unit of a second embodiment.

Next, an electric power control unit 10a of a second embodiment will be described with reference to FIGS. 3 and 4. FIG. 3 shows a block diagram of an electric vehicle 100a including the electric power control unit 10a of the second embodiment. The electric power control unit 10a of the second embodiment differs from the electric power control unit 10 of the first embodiment in that it is provided with five current sensors 7a to 7e. The current sensors 7a to 7e do not have the self-diagnostic function. The current sensor 7a may be termed a first current sensor 7a. The current sensors 7b to 7e may respectively termed second to fifth current sensors 7b to 7e. The first current sensor 7a includes a Hall element 5a and a signal processing circuit 6a. Although not shown, the first current sensor 7a includes a ring-shaped core surrounding the bus bar 14a, and the Hall element 5a is arranged in a gap of the core. The signal, processing, circuit 6a converts a magnitude of magnetic flux measured by the Hall element to a current value, and sends the same to a controller 12a. The same applies to the current sensors 7b to 7c.

The five current sensors 7a to 7e measure the currents of the respective phases of the three-phase alternating current which the inverter 13 outputs. The drive power of the three-phase alternating current outputted by the inverter 13 is transmitted to the connector 25 by the bus bars 14a, 14b, 14c. The three bus bars 14a, 14b, 14c are connected to the three power cables 26 at the connector 25. Drive current of the three-phase alternating current is, supplied to the electric motor 23 through the power cables 26. The bus bar 14a that transmits the first-phase alternating current is provided with the two current sensors (first current sensor 7a and second current sensor 7b). The bus bar 14b that transmits the second-phase alternating current is provided with the two current sensors (third current sensor 7c and fourth current sensor 7d). The bus bar 14c that transmits the third-phase alternating current is provided with one current sensor (fifth current sensor 7e). The controller 12a controls the drive power to be supplied to the electric motor 23 based on measured values of the current sensors 7a to 7e.

The electric power control unit 10a can continue to control the drive power to be supplied to the electric motor 23 even when a failure occurs in one of the five current sensors 7a to 7e by using the remaining current sensors. Further, the electric power control unit 10a can also detect an occurrence of a failure in the remaining current sensors while controlling the drive power using the remaining current sensors.

Figure 4:
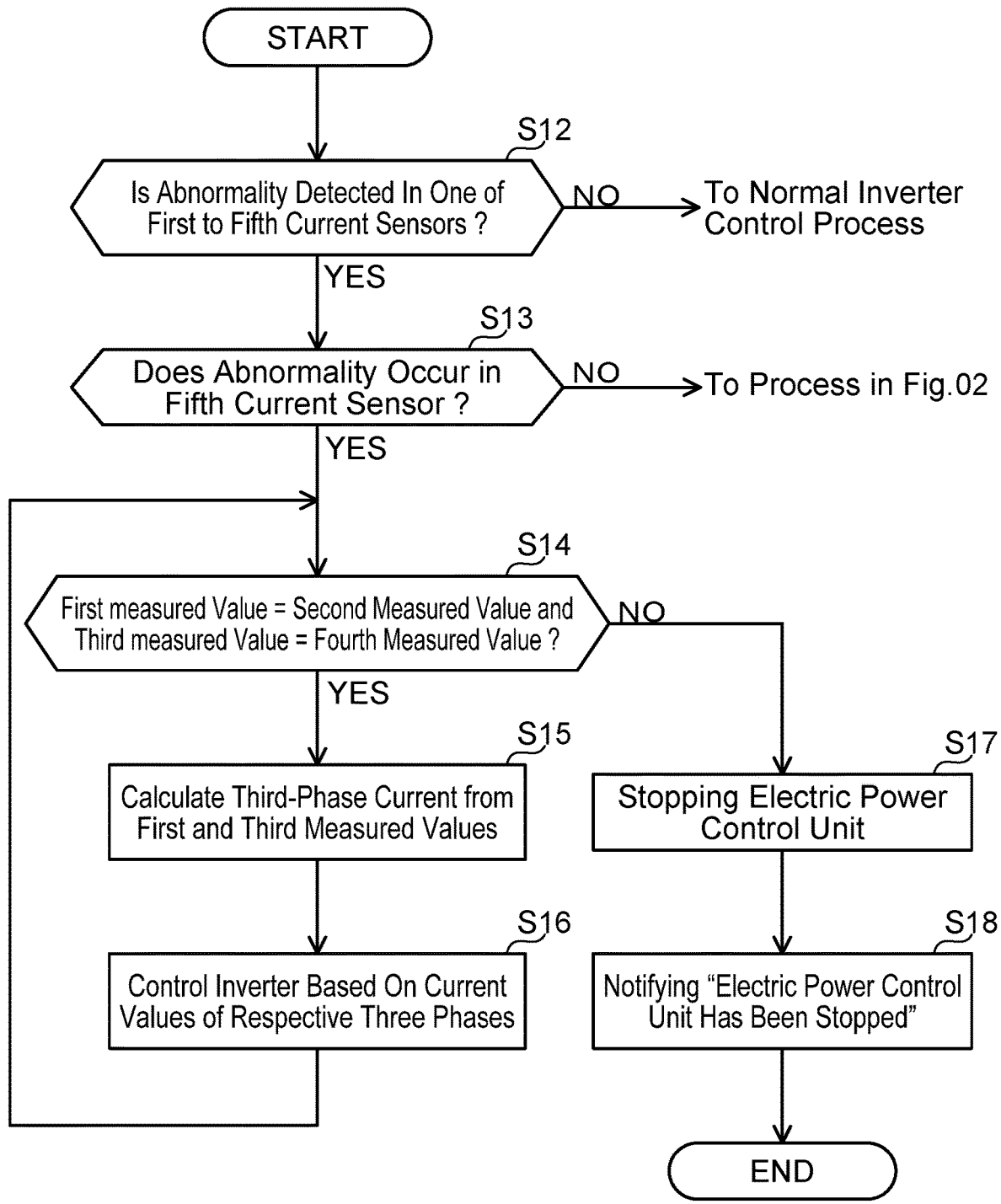
FIG. 4 is a flowchart of a current sensor monitoring process which a controller performs in the second embodiment.

FIG. 4 shows a flowchart of a current sensor monitoring process which the controller 12a performs. The controller 12a performs a normal inverter control until a failure is detected in one of the five current sensors 7a to 7e (step S12: NO). Since five current sensors 7a to 7e are provided for measuring the respective three phase currents, the electric power control unit 10a has the redundancy of two current sensors. Various algorithms for detecting an abnormality in one of the five current sensors 7a to 7e may be considered. An example thereof is shown below.

Firstly, the controller 12a compares a measured value of the first current sensor 7a (first measured value) and a measured value of the second current sensor 7b (second measured value) measuring the current in the same bus bar (bus bar 14a). When the first measured value and the second measured value coincide with each other, it can be determined that the first and the second current sensors 7a, 7b are operating normally. Similarly, the controller 12a compares a measured value of the third current sensor 7c (third measured value) and a measured value of the fourth current sensor 7d (fourth measured value) measuring the current in the same bus bar (bus bar 14b). When the third measured value and the fourth measured value coincide with each other, it can be determined that the third and the fourth current sensors 7c, 7d are operating normally. Unlike the case with the first embodiment, the comparisons of the measured values as above may take place when the inverter 13 is not shut down.

In a case where the first to the fourth current sensors 7a to 7d are determined as operating normally, the controller 12a adds the first and the third measured values to a measured value of the fifth current sensor 7e (fifth measured value). Since the total of the three-phase alternating current is always zero, the fifth current sensor 7e can be determined as operating normally if the total of the first, the third, and the fifth measured values is zero. If the total of the first, the third, and the fifth measured values is not zero, it can be determined that a failure is occurring in the fifth current sensor 7e. On the other hand, when the first and the second measured values do not coincide with each other, it is highly likely that a failure is occurring in one of the first current sensor 7a and the second current sensor 7b. In this case, a total of the first, the third, and the fifth measured values and a total of the second the third, and the fifth measured values are checked. The total of the currents of the respective phases in the three-phase alternating current is always zero. If the total of the first, the third, and the fifth measured values is not zero, it can be determined that a failure is occurring in the first current sensor 7a. On the other hand, if the total of the second, the third, and the fifth measured values is not zero, it can be determined that a failure is occurring in the second current sensor 7b. Here, "a total being zero" means that the total is in a predetermined range close to zero, by taking account of tolerance. As above, in this embodiment, the controller 12a can detect a failure in the current sensors based on the measured values of the five current sensors 7a to 7e.

In a case where a failure is detected in one of the five current sensors 7a to 7e (step S12: YES), the controller 12a specifies the failed current sensor. The failed current sensor can be specified by the algorithm in the aforementioned example. In a case where the failed current sensor is not the fifth current sensor 7e (step S13, NO), the controller 12a proceeds to the process of the flowchart in FIG. 2. However, the process of step S3 of FIG. 2 in this case is not necessary. This is because the third-phase current value can be measured by the fifth current sensor 7e.

On the other hand, in a case where the failed current sensor is the fifth current sensor 7e (step S13: YES), the controller 12a checks whether the measured values of the first and the second current sensors 7a, 7b (first measured value and second measured value) measuring the current in the bus bar 14a coincide with each other. Further, the controller 12a a checks whether the measured values of the third and the fourth current sensors 7c, 7d (third measured value and fourth measured value) measuring the current in the bus bar 14b coincide with each other (step S14). In a case where the first and the second measured values coincide with each other and the third and the fourth measured values coincide with each other, it can be determined that no failure is occurring in the first to the fourth current sensors 7a to 7d (step S14: YES). In this case, the controller 12a calculates the third-phase current value from the first measured value (first-phase current value) and the third measured value (second-phase current value) (step S15). Then, the controller 12a controls the inverter 13 based on the current values of the respective three phases (step S16). That is, the controller 12a continues the control of the drive power to be supplied to the electric motor 23. The controller 12a repeats the processes from step S14.

On the other hand, the controller 12a determines that a failure is occurring, in one of the first and the second current sensors 7a, 7b in a case where the first and the second measured values do not coincide with each other (step S14: NO). Further, the controller 12a determines that a failure is occurring in one of the third and the fourth current sensors 7c, 7d in a case where the third and the fourth measured values do not coincide with each other (step S14; NO). When the determination of step S14 is NO, the controller 12a determines that the inverter 13 can no longer be controlled appropriately from then on, and shuts down the electric power control unit 10a (step S17). Next, the controller 12a notifies that the electric power control unit 10a has been shut down (step S18). Then, the controller 12a terminates the process. A process of step S17 of FIG. 4 is identical to the process of step S6 of FIG. 2, and a process of step S18 of FIG. 4 is identical to the process of step S7 of FIG. 2.

The current sensor monitoring process in the electric power control unit 10a of the second embodiment can be summarized as follows. The electric power control unit 10a is provided with the five current sensors 7a to 7e and the controller 12a. The two current sensors (first and second current sensors 7a, 7b) are provided on the bus bar 14a that transmits the first-phase alternating current of the three-phase alternating current. Two other current sensors (third and fourth current sensors 7c, 7d) are provided on the bus bar 14b that transmits the second-phase alternating current. The remaining current sensor (fifth current sensor 7e) is provided on, the bus bar 14c that transmits the third-phase alternating current. The controller 12a detects an abnormality in the current sensors based on the measured values of the first to the fifth current sensors 7a to 7e. Here, when an abnormality in the fifth current sensor 7e is detected, the controller 12a performs the following process of (1) or (2). (1) in the case where the measured values of the first current sensor 7a and the second current sensor 7b coincide with each other and the measured values of the third current sensor 7c and the fourth current sensor 7d coincide with each other, the third-phase current is calculated from the measured values of the first current sensor 7a and the third current sensor 7c, and the control of the drive power of the electric motor 23 is continued based on the current values of the respective three phases. (2) In the case where the measured values of the first current sensor 7a and the second current sensor 7b do not coincide with each other, or the measured values of the third current sensor 7c and the fourth current sensor 7d do not coincide with each other, the controller 12a stops to further supply the drive power to the electric motor 23.

In a case where an abnormality in the first current sensor 7a is detected based on the measured values of the first to the fifth current sensors 7a to 7e, the controller 12a performs the following process of (3) or (4). (3) In the case where the measured values of the second current sensor 7b, the third current sensor 7c, and the fourth current sensor 7d while the inverter 13 is shut down coincide with each other, the controller 12a continues to control the drive power of the electric motor 23 based on the measured values of the second current sensor 7b, the third current sensor 7c, and the fifth current sensor 7e. (4) In the case where the measured values of the second current sensor 7b, the third current sensor 7c, and the fourth current sensor 7d while the inverter 13 is shut down do not coincide with each other, the controller 12a stops to further supply the drive power to the electric motor 23.

When one current sensor fails, the electric power control unit 10a of the second embodiment can also continue to control the drive power by the remaining current sensors, and monitor the remaining current sensors in the meantime.

Some features of the technique described in the embodiments will be noted. The current sensors 2a to 2d of the first embodiment have the self-diagnostic function. The controller 12 may immediately shut down the electric power control unit 10 and notify the shutdown of the electric power control unit when a self-diagnostic result indicating an occurrence of an abnormality from one of the remaining current sensors 2b to 2d while performing the process of the flowchart of FIG. 2. As aforementioned, in the technique disclosed herein, the current sensors 2a to 2d of the first embodiment may not be provided with the self-diagnostic function.

Figure 5:
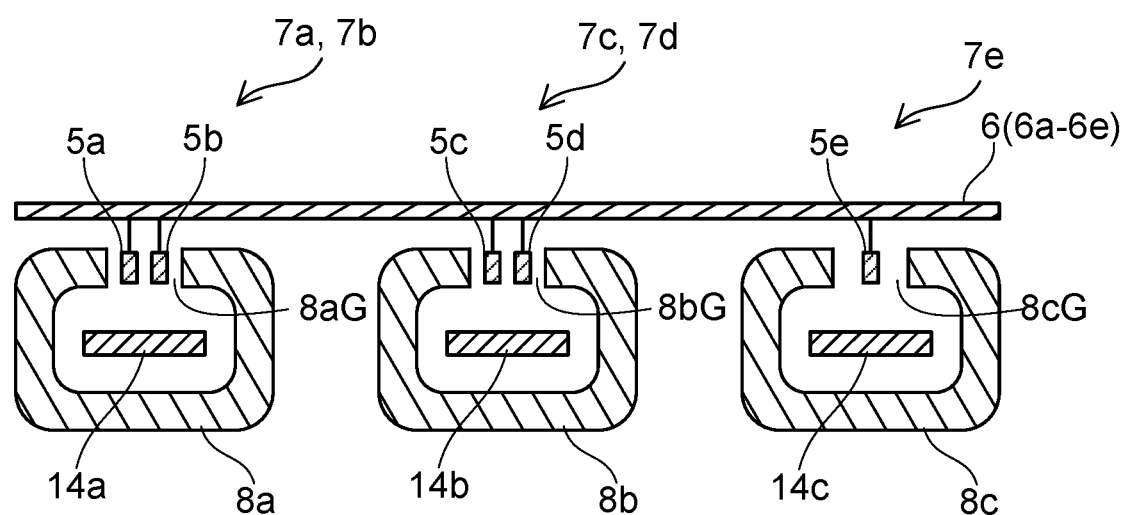
FIG. 5 is a diagram showing an example of a relationship between a Hall element, a core, and a bus bar.

The current sensors have ring-shaped cores. The two current sensors provided on each bus bar may share the ring-shaped core. FIG. 5 shows an example of an arrangement of the five current sensors 7a to 7e in the electric power control unit 10a of the second embodiment. FIG. 5 shows a cross section traversing through the bus bars 14a, 14b, 14c and the current sensors 7a to 7e. One ring-shaped core 8a is provided to surround the bus bar 14a. The ring-shaped core 8a includes a gap 8aG. The hail element 5a of the first current sensor 7a and the Hall element 5b of the second current sensor 7b are arranged in the gap 8aG. The Hall elements 5a, 5b are connected to a circuit board 6.

One ring-shaped core 8b is provided to surround the bus bar 14b. The ring-shaped core 8b includes a gap 8bG. The Hall element 5c of the third current sensor 7c and the Hall element 5d of the fourth current sensor 7d are arranged in the gap 8bG. The Hall elements 5c, 5d are connected to the circuit board 6.

One ring-shaped core 8c is provided to surround the bus bar 14c. The ring-shaped core 8c includes a gap 8cG. The Hall element 5e of the fifth current sensor 7e is arranged in the gap 8cG. The Hall element 5e is connected to the circuit board 6. The signal processing circuits 6a to 6e of the first to the fifth current sensors 7a to 7e are mounted on the circuit board 6. In the example of FIG. 5, the ring-shaped core 8a is shared by the first and the second current sensors 7a, 7b and the ring-shaped core 8b is shared by the third and the fourth current sensors 7c, 7d. Further, the signal processing circuits 6a to 6e of the first to the fifth current sensors 7a to 7e are provided on the single circuit board 6.

The electric power control unit disclosed herein may employ current sensors that do not have cores.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. An electric power control unit configured to control drive power of a three-phase alternating current to be supplied to an electric motor, the electric power control unit comprising:
    an inverter configured to convert a direct current to the three-phase alternating current;
    first and second current sensors, each of which is configured to measure a first-phase current in the three-phase alternating current;
    third and fourth current sensors, each of which is configured to measure a second-phase current in the three-phase alternating current; and
    a controller configured to control the inverter,
    wherein
    under a condition in which the first current sensor fails, when measured values of the second, the third, and the fourth current sensors do not coincide with each other while the inverter is shut down, the controller stops to further supply the drive power to the electric motor.

2. The electric power control unit of claim 1, wherein when the measured values of the second, the third, and the fourth current sensors coincide with each other while the inverter is shut down, the controller continues supply of the drive power to the electric motor.

3. The electric power control unit of claim 1, wherein the first current sensor is provided with a self-diagnostic function.

4. An electric power control unit configured to control drive power of a three-phase alternating current to be supplied to an electric motor, the electric power control unit comprising:
    an inverter configured to convert a direct current to the three-phase alternating current;
    first and second current sensors, each of which is configured to measure a first-phase current in the three-phase alternating current;
    third and fourth current sensors, each of which is configured to measure a second-phase current in the three-phase alternating current;
    a fifth current sensor configured to measure a third-phase current in the three-phase alternating current; and
    a controller configured to control the inverter,
    wherein
    under a condition in which the fifth current sensor fails, when measured values of the first and the second current sensors do not coincide with each other or measured values of the third and the fourth current sensors do not coincide with each other, the controller stops to further supply the drive power to the electric motor.

5. The electric power control unit of claim 4, wherein when the measured values of the first and the second current sensors coincide with each other and the measured values of the third and the fourth current sensors coincide with each other, the controller continues supply of the drive power to the electric motor.

6. An electric power control unit configured to control drive power of a three-phase alternating current to be supplied to an electric motor, the electric power control unit comprising:
    an inverter configured to convert a direct current to the three-phase alternating current;
    first and second current sensors, each of which is configured to measure a first-phase current in the three-phase alternating current;
    third and fourth current sensors, each of which is configured to measure a second-phase current in the three-phase alternating current;
    a fifth current sensor configured to measure a third-phase current in the three-phase alternating current; and
    a controller configured to control the inverter,
    wherein
    under a condition in which the first current sensor fails, when measured values of the second, the third, and the fourth current sensors do not coincide with each other while the inverter is shut down, the controller stops to further supply the drive power to the electric motor.

7. The electric power control unit of claim 6, wherein when the measured values of the second, the third, and the fourth current sensors coincide with each other while the inverter is shut down, the controller continues supply of the drive power to the electric motor.

* * * * *

UNITED STATES PATENT AND TRADEMARK OFFICE
CERTIFICATE OF CORRECTION

PATENT NO. : 10,833,623 B2
APPLICATION NO. : 16/216023
DATED : November 10, 2020
INVENTOR(S) : Wataru Nakayama It is certified that error appears in the above-identified patent and that said Letters Patent is hereby corrected as shown below:

On the Title Page

Item (71), applicant, city, delete "Kariya" and insert --Kariya-city, Aichi-pref--, therefor.

Item (72), inventor, city, delete "Nisshin" and insert --Nisshin-shi Aichi-ken--, therefor.

Item (73), assignee, city, delete "Kariya" and insert --Kariya-city, Aichi-pref--, therefor.

In the Specification

In Column 2, Line(s) 42, after "measured", delete ",".

In Column 6, Line(s) 38, delete "front" and insert --from--, therefor.

In Column 6, Line(s) 56, delete "tinting" and insert --timing--, therefor.

In Column 9, Line(s) 64, after "occurring", delete ",".

In Column 10, Line(s) 25, after "on", delete ",".

In Column 11, Line(s) 19, delete "hail" and insert --Hall--, therefor.

Signed and Sealed this
Second Day of February, 2021

Drew Hirshfeld
*Performing the Functions and Duties of the*
*Under Secretary of Commerce for Intellectual Property and*
*Director of the United States Patent and Trademark Office*